United States Patent
Wu

(10) Patent No.: US 9,881,976 B2
(45) Date of Patent: *Jan. 30, 2018

(54) ORGANIC LIGHT-EMITTING DIODE (OLED) DISPLAY PANEL AND DISPLAY DEVICE

(71) Applicant: BOE TECHNOLOGY GROUP CO., LTD., Beijing (CN)

(72) Inventor: Chang Yen Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/429,691

(22) PCT Filed: May 28, 2014

(86) PCT No.: PCT/CN2014/078711
§ 371 (c)(1),
(2) Date: Mar. 19, 2015

(87) PCT Pub. No.: WO2015/100931
PCT Pub. Date: Jul. 9, 2015

(65) Prior Publication Data
US 2016/0163772 A1    Jun. 9, 2016

(30) Foreign Application Priority Data
Jan. 6, 2014    (CN) .......................... 2014 1 0005179

(51) Int. Cl.
*H01L 51/50* (2006.01)
*H01L 51/52* (2006.01)
*H01L 27/32* (2006.01)

(52) U.S. Cl.
CPC ...... *H01L 27/3218* (2013.01); *H01L 27/3211* (2013.01); *H01L 51/5004* (2013.01);
(Continued)

(58) Field of Classification Search
CPC ............ H01L 51/5278; H01L 51/5012; H01L 51/5004; H01L 51/5234; H01L 51/5096;
(Continued)

(56) References Cited

U.S. PATENT DOCUMENTS 9,608,044 B2 *  3/2017  Wu ...................... H01L 27/3211
2004/0056590 A1 * 3/2004  Lim ..................... H01L 51/5265
                                                        313/506

(Continued)

FOREIGN PATENT DOCUMENTS

| CN | 102163615 A | 8/2011 |
| CN | 102856507 A | 1/2013 |

(Continued)

OTHER PUBLICATIONS

Oct. 10, 2014—(WO) ISR—App. No. PCT/CN14/078711—with Eng Tran of Written Opinion.

(Continued)

*Primary Examiner* — Caridad Everhart
(74) *Attorney, Agent, or Firm* — Banner & Witcoff, Ltd.

(57) ABSTRACT

An organic light-emitting diode (OLED) display panel and a display device are provided. A pixel unit of the OLED display panel includes a first sub-pixel, a second sub-pixel and a third sub-pixel and further includes an anode layer, a cathode layer and an organic function layer. The organic function layer includes: a first emission layer (EML1) configured to cover at least two adjacent sub-pixels comprising the first sub-pixel; a carrier blocking layer (CBL) configured to cover the second sub-pixel and the third sub-pixel; a second emission layer (EML2) arranged at an area provided with the first sub-pixel and the second sub-pixel and configured to at least cover the second sub-pixel; and a third emission layer (EML3) configured to cover at least two (Continued)

adjacent sub-pixels comprising the third sub-pixel. The OLED display panel can improve the pixel density.

14 Claims, 3 Drawing Sheets

(52) U.S. Cl.
CPC ........ *H01L 51/504* (2013.01); *H01L 51/5012* (2013.01); *H01L 51/5096* (2013.01); *H01L 51/5234* (2013.01); *H01L 51/5265* (2013.01); *H01L 2251/552* (2013.01); *H01L 2251/558* (2013.01)

(58) Field of Classification Search
CPC ............... H01L 51/504; H01L 27/3211; H01L 27/3218; H01L 2251/552; H01L 51/5265; H01L 2251/558
USPC .............................................. 438/35; 345/46
See application file for complete search history.

(56) References Cited

U.S. PATENT DOCUMENTS

| | | |
|---|---|---|
| 2006/0238119 A1 | 10/2006 | Spindler |
| 2007/0046195 A1 | 3/2007 | Chin et al. |
| 2007/0075312 A1 | 4/2007 | Chin et al. |
| 2010/0090241 A1 | 4/2010 | D'Andrade et al. |
| 2011/0180825 A1* | 7/2011 | Lee ..................... H01L 27/3211 257/89 |
| 2013/0001612 A1* | 1/2013 | Lee ..................... H01L 27/3211 257/98 |
| 2013/0147689 A1* | 6/2013 | Liu .......................... G09G 3/30 345/76 |
| 2013/0207085 A1* | 8/2013 | Im ......................... H01L 51/504 257/40 |
| 2015/0001480 A1* | 1/2015 | Kim .................... H01L 51/5265 257/40 |
| 2015/0194624 A1* | 7/2015 | Jeong .................. H01L 51/5072 257/40 |

FOREIGN PATENT DOCUMENTS

| | | |
|---|---|---|
| CN | 103779387 A | 5/2014 |
| CN | 103824875 A | 5/2014 |

OTHER PUBLICATIONS

Jan. 29, 2015—(CN)—First Office Action Appn 201410005179.X with English Tran.
Jul. 24, 2015—(CN)—Second Office Action Appn 201410005179.X with English Tran.

* cited by examiner

ORGANIZING LIGHT-EMITTING DIODE (OLED) DISPLAY PANEL AND DISPLAY DEVICE

The application is a U.S. National Phase Entry of International Application No. PCT/CN2014/078711 filed on May 28, 2014, designating the United States of America and claiming priority to Chinese Patent Application No. 201410005179.X filed on Jan. 6, 2014. The present application claims priority to and the benefit of the above-identified applications and the above-identified applications are incorporated by reference herein in their entirety.

TECHNICAL FIELD

Embodiments of the present invention relate to an organic light-emitting diode (OLED) display panel and a display device.

BACKGROUND

An OLED display is a display device in which light is emitted by means of the electroluminescence of fluorophor or phosphor organic compounds. The OLED display drives a plurality of OLEDs to display images. Each OLED includes an anode, an organic function layer and a cathode. The organic function layer generally includes an emission layer (EML), an electron transport layer (ETL) and a hole transport layer (HTL). Thus, the balance between injected electrons and injected holes can be improved, and hence the luminous efficiency can be improved.

In the OLED, in order to display the entire color gamut, for instance, red (R), green (G) and blue (B) EMLs may be respectively patterned. In order to pattern the EMLs, a shadow mask can be used in the case of small molecular OLEDs, and inkjet printing method or laser induced thermal imaging (LITI) method may be used in the case of polymer OLEDs. An organic layer may be finely patterned by the LITI method. The LITI method may be used in the case of large area. Moreover, the LITI method has the advantage of high resolution.

High pixels per inch (PPI) display devices belong to a main development trend of the current display device, and high PPI OLED display panels are of a top-emission structure. An OLED production technology mainly adopts a fine metal mask (FMM) and a side-by-side pixel arrangement to achieve the full-color display of the OLED.

SUMMARY

At least one embodiment of the present invention provides an OLED display panel and a display device, which can improve the pixel density of the OLED display panel on the premise that FMM accuracy is unchanged, has no loss of luminous efficiency, and does not have the problem of color shift due to view angle.

A pixel unit of the OLED display panel includes a first sub-pixel for displaying the first color, a second sub-pixel for displaying the second color and a third sub-pixel for displaying the third color. Each pixel unit includes an anode layer, a cathode layer and an organic function layer disposed between the anode layer and the cathode layer. The organic function layer includes: an EML1 configured to cover at least two adjacent sub-pixels comprising the first sub-pixel; a CBL configured to cover the second sub-pixel and the third sub-pixel; an EML2 arranged at an area provided with the first sub-pixel and the second sub-pixel and configured to at least cover the second sub-pixel; and an EML3 configured to cover at least two adjacent sub-pixels comprising the third sub-pixel.

At least one embodiment of the present invention further provides a display device, which comprises the foregoing OLED display panel.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The FMM technology has many technical difficulties such as the problems of mask manufacturing and cleaning and the problems of alignment and expansion of FMM in the manufacturing process. These problems result in serious color-mix phenomenon of displays, low production yield and high manufacturing cost. As the FMM accuracy is difficult to control, it is difficult to realize high PPI OLEDs. In addition, due to complex optical effect by a top-emission structure, more difficulties are produced in a structural design.

In order to improve the pixel density, the following two proposals are mainly adopted at present.

Figure 1:
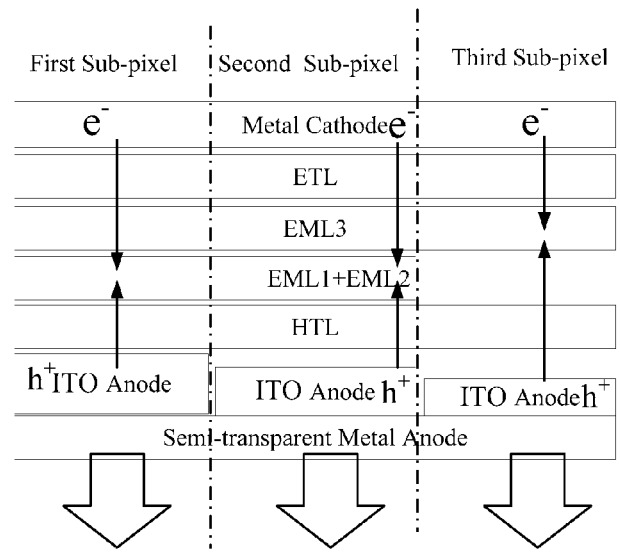
FIG. 1 is a schematic structural view of an OLED display panel.

1. As illustrated in FIG. 1, each pixel unit includes three sub-pixels for emitting light of different colors, namely a first sub-pixel, a second sub-pixel and a third sub-pixel. Firstly, two EMLs of two colors (e.g., R and G) are prepared on the first sub-pixel and the second sub-pixel at the same time. Secondly, one color is extracted by microcavity effect (e.g., R is extracted from the first sub-pixel and G is extracted from the second sub-pixel) according to the different thicknesses of the two sub-pixels (e.g., as illustrated in FIG. 1, the thickness of an indium tin oxide (ITO) anode of the first sub-pixel is greater than the thickness of an ITO anode of the second sub-pixel). Thirdly, an EML of the third color (e.g., B) is formed in the entire pixel region. But the OLED display device manufactured by the method has serious color shift problem along with the view angle transformation. Moreover, a portion of luminous efficiency of the EMLs of the two colors prepared at the same time will be sacrificed.

Figure 2:
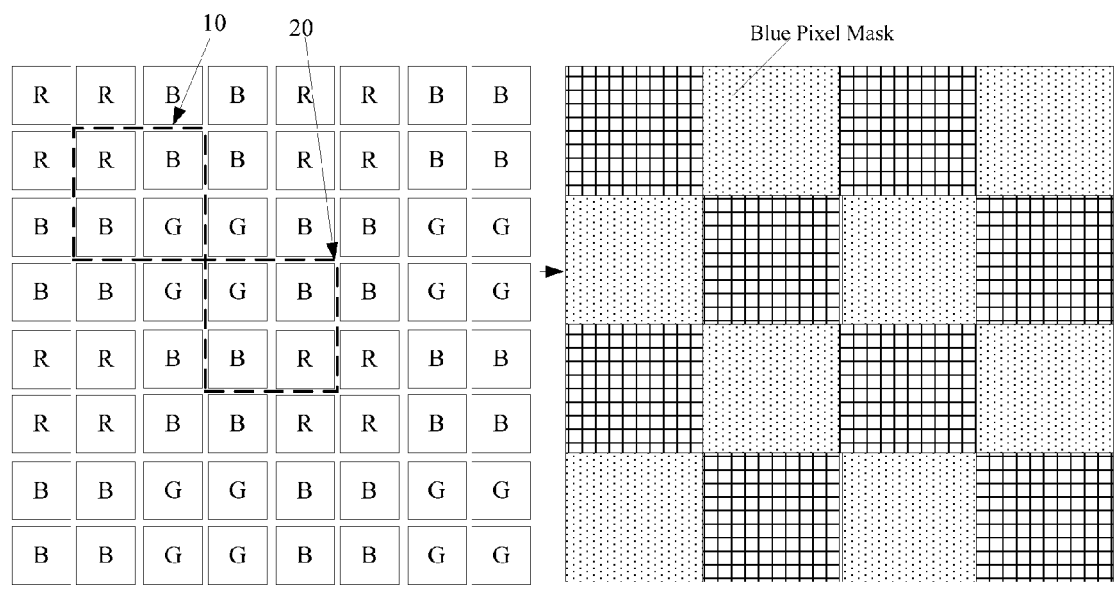
FIG. 2 is a schematic diagram in which EMLs are prepared by means of FMM having a large opening.

2. As illustrated in FIG. 2, EMLs of sub-pixels of a same color in different pixels are evaporated by means of FMM having a large opening at the same time (as illustrated in FIG. 2, blue EMLs are evaporated in different pixels at the same time by a blue pixel mask with a large opening). However, the method will result in inconsistent sequence of sub-pixels in different pixels (as illustrated in FIG. 2, the sequence of sub-pixels of different colors in a first pixel 10 and a second pixel 20 is different), and hence zigzag images with discontinuous lines will be produced in image display.

At least one embodiment of the present invention provides an OLED display panel and a display device, which can improve the pixel density of the OLED display panel on the premise that FMM accuracy is unchanged.

A pixel unit of the OLED display panel includes a first sub-pixel for displaying the first color, a second sub-pixel for displaying the second color and a third sub-pixel for displaying the third color. Each pixel unit includes an anode layer, a cathode layer and an organic function layer disposed between the anode layer and the cathode layer. The organic function layer includes: an EML1 configured to cover at least two adjacent sub-pixels comprising the first sub-pixel; a CBL configured to cover the second sub-pixel and the third sub-pixel and prevent charges on adjacent two sides of the CBL from passing through the CBL; an EML2 only disposed in an area provided with the first sub-pixel and the second sub-pixel and configured to at least cover the second sub-pixel; and an EML3 configured to cover at least two adjacent sub-pixels comprising the third sub-pixel.

The LUMO energy level of a matrix substance of the CBL, a matrix substance of the EML3, a matrix substance of the EML2 and a matrix substance of the EML1 is sequentially reduced.

Moreover, the optical thickness $T_1$ of the first sub-pixel, the optical thickness $T_2$ of the second sub-pixel and the optical thickness $T_3$ of the third sub-pixel satisfy the following relationship:

$$T_1:T_2:T_3=(\lambda_1/n_1):(\lambda_2/n_2):(\lambda_3/n_3),$$

where the optical thickness of the sub-pixel refers to the sum of the thickness of function layers in each sub-pixel; $\lambda_1$, $\lambda_2$ and $\lambda_3$ respectively represent the wavelengths of the light of the first color, the light of the second color and the light of the third light; and $n_1$, $n_2$ and $n_3$ respectively represent the reflective index of the materials of function layers of sub-pixels under the condition of the light of the first color, the light of the second color and the light of the third color.

Or the HOMO energy level of a matrix substance of the EML1, a matrix substance of the EML2, a matrix substance of the EML3 and a matrix substance of the CBL is sequentially reduced.

Moreover, the optical thickness $T_1$ of the first sub-pixel, the optical thickness $T_2$ of the second sub-pixel and the optical thickness $T_3$ of the third sub-pixel satisfy the following relationship:

$$T_1:T_2:T_3=(\lambda_1/n_1):(\lambda_2/n_2):(\lambda_3/n_3),$$

where the optical thickness of the sub-pixel refers to the sum of the thickness of function layers in each sub-pixel; $\lambda_1$, $\lambda_2$ and $\lambda_3$ respectively represent the wavelength of the light of the first color, the light of the second color and the light of the third light; and $n_1$, $n_2$ and $n_3$ respectively represent the reflective index of materials of function layers of sub-pixels under the condition of the light of the first color, the light of the second color and the light of the third color.

In at least one embodiment of the present invention, it should be noted that: if the OLED display panel does not comprise a TCL, the optical thickness of the sub-pixel is the thickness of the organic function layer of the sub-pixel. For instance, the optical thickness $T_1$ of the first sub-pixel is the thickness of the organic function layer of the first sub-pixel. Other sub-pixels are also similar. No further description will be given here.

Or if the OLED display panel comprises a TCL, the optical thickness of the sub-pixel is the sum of the thickness of the organic function layer of the sub-pixel and the thickness of the TCL (the situation for a semi-transparent layer may refer to this). For instance, the optical thickness $T_1$ of the first sub-pixel is the sum of the thickness of the organic function layer of the first sub-pixel and the thickness of the TCL. Other sub-pixels are also in a similar situation. No further description will be given here. The TCL may be a transparent conducting oxide (TCO) layer, e.g., indium tin oxide (ITO), indium zinc oxide (IZO), aluminum-doped zinc oxide (AZO) or fluorine-doped tin oxide (FTO). The TCL may be taken as a cathode layer or an anode layer or a part of an electrode layer and may also be taken as a thickness adjustment layer.

In the OLED display panel provided by at least one embodiment of the present invention, the EML1, the CBL, the EML2 and the EML3 may cover at least two sub-pixels. In this way, when the EMLs are prepared by utilization of FMM, the minimum opening of the FMM may be as large as two sub-pixel regions. Thus, the pixel density of the OLED display panel can be improved on the premise that FMM accuracy is unchanged. That is to say, in the OLED display panel provided by at least one embodiment of the present invention, the EMLs, the area of which is twice as large as the normal EMLs, can be evaporated in one manufacturing process. Moreover, each sub-pixel emits light of a specific color. Thus, the OLED display panel can be manufactured by utilization of FMM with a large opening and low accuracy. If FMM with same accuracy is used, the PPI of the panel can be improved two times in this way.

In the OLED display panel provided by at least one embodiment of the present invention, the energy level of the matrix substances of the EMLs and the thickness of the sub-pixels are optimized so that each sub-pixel emits light of a specific color. Moreover, the problem of color shift can be avoided. Furthermore, the luminous efficiency will not suffer loss, and hence the image quality can be improved.

Figure 3:
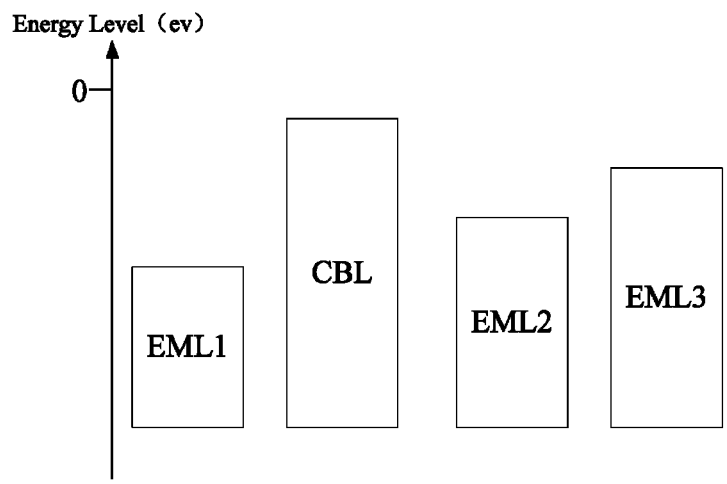
FIG. 3 is a schematic diagram illustrating the LUMO energy level of EMLs and a CBL in a first embodiment of the present invention.
Figure 5:
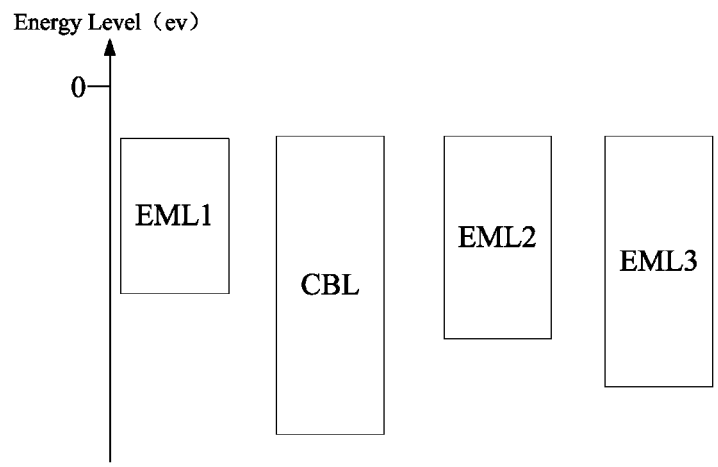
FIG. 5 is a schematic diagram illustrating the HOMO energy level of EMLs and a CBL in a second embodiment of the present invention.

In addition, in the OLED display panel provided by at least one embodiment of the present invention, the sequence of the sub-pixels is also not changed, and hence the image display will not be affected. It should be noted that the LUMO value and the HOMO value are generally negative values. In the embodiment of the present invention, as illustrated in FIGS. 3 and 5, the energy level is defined to be higher when closer to the vacuum level and defined to be lower when farther from the vacuum level. The expression "sequentially reduced" of the HOMO energy level refers to the sequential increase of an absolute value of the value of the HOMO energy level. Similarly, the expression "sequentially reduced" of the LUMO energy level refers to the sequential increase of an absolute value of the value of the LUMO energy level.

In addition, it should be noted that: in at least one embodiment of the present invention, only the relationship of the LUMO energy level of the matrix substances of the EMLs is simply limited or the relationship of the HOMO energy level of the matrix substances of the EMLs is simply limited, so that the inside of a specific sub-pixel only emits light of a specific color.

It should be understood that: in an actual application, the relationship of the LUMO energy level and the HOMO energy level of the matrix substances of the EMLs may also be comprehensively considered, so that holes and electrons are combined within corresponding EMLs of specific colors to form excitons inside of a specific sub-pixel, and hence the inside of the specific sub-pixel emits light of a specific color.

For instance, in at least one embodiment of the present invention, when the matrix substances of the EMLs are prepared, in the first sub-pixel, the HOMO energy level of the matrix substance of the EML1, the matrix substance of the EML2, the matrix substance of the EML3 and the matrix substance of the CBL is sequentially reduced; and in the second sub-pixel, the LUMO energy level of the matrix substance of the CBL, the matrix substance of the EML3, the matrix substance of the EML2 and the matrix substance of the EML1 is sequentially reduced.

For instance, in at least one embodiment of the present invention, the OLED display panel may sequentially comprise: the EML1 configured to cover the entire pixel unit; the CBL configured to cover the second sub-pixel and the third sub-pixel; the EML2 configured to cover the first sub-pixel and the second sub-pixel; and the EML3 configured to cover the entire pixel unit.

For instance, in at least one embodiment of the present invention, the OLED display panel may sequentially comprise: the EML1 configured to cover the entire pixel unit; the CBL configured to cover the second sub-pixel and the third sub-pixel; the EML2 configured to cover the first sub-pixel and the second sub-pixel; and the EML3 configured to cover the second sub-pixel and the third sub-pixel. For instance, in at least one embodiment of the present invention, the OLED display panel may sequentially comprise: the EML1 configured to cover the first sub-pixel and the second sub-pixel; the CBL configured to cover the second sub-pixel and the third sub-pixel; the EML2 configured to cover the first sub-pixel and the second sub-pixel; and the EML3 configured to cover the entire pixel unit.

For instance, in at least one embodiment of the present invention, the OLED display panel may sequentially comprise: the EML1 configured to cover the first sub-pixel and the second sub-pixel; the CBL configured to cover the second sub-pixel and the third sub-pixel; the EML2 configured to cover the first sub-pixel and the second sub-pixel; and the EML3 configured to cover the second sub-pixel and the third sub-pixel.

For instance, in at least one embodiment of the present invention, the optical thickness $T_1$ of the first sub-pixel, the optical thickness $T_2$ of the second sub-pixel and the optical thickness $T_3$ of the third sub-pixel satisfy the following relationship:

$$1.3 \leq T_2/T_1 \leq 2.0;$$

$$1.1 \leq T_3/T_1 \leq 1.5.$$

For instance, in at least one embodiment of the present invention, the OLED display panel may comprise: a trans-parent or semi-transparent anode layer; an HTL on the semi-transparent anode layer; the EML1 on the HTL; the CBL on the EML1; the EML2 on the CBL; the EML3 on the EML2; an ETL on the EML3; and a metal cathode layer on the ETL.

For instance, in at least one embodiment of the present invention, the OLED display panel may comprise: a transparent or semi-transparent anode layer; an HTL on the semi-transparent anode layer; the EML3 on the HTL; the EML2 on the EML3; the CBL on the EML2; the EML1 on the CBL; an ETL on the EML1; and a metal cathode layer on the ETL.

At least one embodiment of the present invention further provides a display device, which comprises the foregoing OLED display panel. The structure and the working principle of the OLED display panel are the same as those of the above embodiments. No further description will be given here. In addition, the structure of other parts of the display device may refer to the current technology. No detailed description will be given here. The display device may be: any product or component with display function such as e-paper, a TV, a display, a digital picture frame, a mobile phone and a tablet PC.

Detailed description will be given below to the OLED display panel provided by the present invention with reference to the following preferred embodiments.

First Embodiment

In the OLED display panel provided by the embodiment, the OLED display panel comprises first sub-pixels for displaying blue, second sub-pixels for displaying red and third sub-pixels for displaying green. The OLED display panel comprises anode layers, cathode layers and organic function layers. The organic function layer includes the following layer structures: an EML1 configured to cover at least two adjacent sub-pixels comprising the first sub-pixel and emit blue light; a CBL configured to cover the second sub-pixel and the third sub-pixel; an EML2 configured to cover the first sub-pixel and the second sub-pixel and emit red light; and an EML3 configured to cover at least two adjacent sub-pixels comprising the third sub-pixel and emit green light.

As illustrated in FIG. 3, the LUMO energy level of the EML1, the EML2, the EML3 and the CBL is all negative. The LUMO energy level of the EML1 is lower than the LUMO energy level of the EML2; the LUMO energy level of the EML2 is lower than the LUMO energy level of the EML3; and the LUMO energy level of the EML3 is lower than the LUMO energy level of the CBL. Moreover, the optical thickness $T_1$ of the first sub-pixel, the optical thickness $T_2$ of the second sub-pixel and the optical thickness $T_3$ of the third sub-pixel satisfy the following relationship:

$$T_1:T_2:T_3=(\lambda_1/n_1):(\lambda_2/n_2):(\lambda_3/n_3),$$

where $\lambda_1$, $\lambda_2$ and $\lambda_3$ respectively represent the wavelength of light of the first color, light of the second color and light of the third light; and $n_1$, $n_2$ and $n_3$ respectively represent the reflective index of materials of function layers of sub-pixels under the condition of the light of the first color, the light of the second color and the light of the third color.

Figure 4:
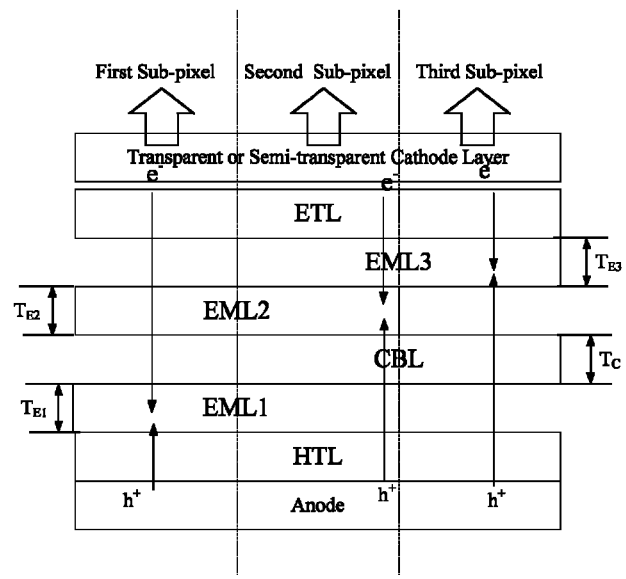
FIG. 4 is a schematic structural view of an OLED display panel provided by the first embodiment of the present invention.

In the embodiment, as illustrated in FIG. 4, the OLED display panel may comprise: an anode layer; an HTL on the anode layer; an EML1 configured to cover the first sub-pixel and the second sub-pixel; a CBL configured to cover the second sub-pixel and the third sub-pixel; an EML2 configured to cover the first sub-pixel and the second sub-pixel; an EML3 configured to cover the second sub-pixel and the third sub-pixel; an ETL on the EML3; and a transparent or semi-transparent cathode layer on the ETL.

The transparent cathode layer may be made from transparent conducting oxide (TCO). The semi-transparent cathode layer may be made, from a metal material, to be thin and semi-transparent.

In the OLED display panel provided by the embodiment, electrons move from the cathode layer to the anode layer, can easily jump from an EML with higher LUMO energy level to an EML with a lower LUMO energy level, but cannot easily jump from an EML with a lower LUMO energy level to an EML with a higher LUMO energy level. When the electrons are retained within a specific EML, the electrons are combined with holes again to form excitons to emit light.

In the OLED display panel as shown in FIG. 4, as for the first sub-pixel region, electrons are injected from the cathode layer. As the LUMO energy level of the EML2 is higher than the LUMO energy level of the EML1, the electrons can easily jump from the EML2 to the EML 1 and are retained within the EML 1 to excite the EML 1 to emit blue light, and hence the first sub-pixel displays blue light. As for the second sub-pixel region, as the LUMO energy level of the EML3 is higher than the LUMO energy level of the EML2 and the LUMO energy level of the CBL is higher than the LUMO energy level of the EML2, electrons can easily jump from the EML3 to the EML2 and are retained within the EML2 to excite the EML2 to emit red light due to the limitation of the CBL energy level, and hence the second sub-pixel displays red light. As for the third sub-pixel region, as the LUMO energy level of the EML3 is lower than the LUMO energy level of the CBL, electrons will not easily run through the CBL and are retained within the EML3 to excite the EML3 to emit green light, and hence the third sub-pixel displays green light.

In addition, in the embodiment, the OLED display panel may adopt a top-emission structure. That is to say, the top layer adopts a semi-transparent electrode to ensure that light can be emitted, and that the light color and the efficiency are those desired. The optical behavior of the OLED adopting the top-emission structure can be calculated on the basis of the wave-optical standing-wave condition:

$$\varphi_1 + \varphi_2 + 2\frac{2\pi}{\lambda}nL\cos\theta = 2m\pi; \qquad (I)$$

where φ refers to the phase difference caused by a reflector; n refers to the ambient refractive index, which indicates a same material will have different refractive indexes under the condition of light with different wavelengths; L refers to the cavity length (the optical thickness of the sub-pixel); θ refers to an angle; λ refers to a wavelength; and m is an integer.

Based on the formula (I), in the embodiment, the optical thickness of the first sub-pixel, the second sub-pixel and the third sub-pixel for displaying different colors is optimized, and the ratio of the resonant cavity length optimized by different light colors is the ratio of λ/n, namely:

$$T_1:T_2:T_3=(\lambda_1/n_1):((\lambda_2/n_2):(\lambda_3/n_3) \qquad (II).$$

In the embodiment, the first sub-pixel displays B; the second sub-pixel displays R; and the third sub-pixel displays G. In general, the wave crest of the red light R is 600 nm to 620 nm; the wave crest of the green light G is 520 nm to 530 nm; and the wave crest of the blue light B is 450 nm to 465 nm. As for one material, the refractive index of light is different when light with a different wavelength is irradiated thereon. In the case of a same material, the refractive index for the blue light and the refractive index for the green light are greater than the refractive index for the red light.

Thus, after the combination of the above formulas (I) and (II), the optimized thickness design of the OLED display panel provided by the embodiment is as follows:

$$1.3 \le T_2/T_1 \le 2.0 \qquad (III);$$

$$1.1 \le T_3/T_1 \le 1.5 \qquad (IV).$$

In addition, as illustrated in FIG. 4, in the OLED display panel provided by the embodiment, the relationships among the optical thickness $T_1$ of the first sub-pixel, the optical thickness $T_2$ of the second sub-pixel, the optical thickness $T_3$ of the third sub-pixel, the film thickness $T_{E1}$ of the EML1, the film thickness $T_{E2}$ of the EML2, the film thickness $T_{E3}$ of the EML3 and the film thickness $T_C$ of the CBL are also as follows:

$$T_2-T_1=T_{E3}+T_C \qquad (V);$$

$$T_2-T_3=T_{E1}+T_{E2} \qquad (VI).$$

In the OLED device adopting the top-emission structure, as the top layer adopts the semi-transparent electrode, the optical effect will be strong, which is referred to as microcavity effect. The influence of the film thickness on the light color is very strong. Moreover, the above optimized thickness design is adopted to ensure that the problems of color mixing and color shift can be avoided at a large visual angle.

In addition, as the thicknesses of the function layers of the conventional OLED device (particularly obvious for devices with microcavity effect) are independently adjusted according to the color requirement of each sub-pixel, in the OLED display panel adopting the top-emission structure provided by the embodiment, the thickness of each function layer is related to other function layers and other sub-pixels and influenced by each other, and hence it is complicated to adjust the thickness of the function layers. In view of this, the thicknesses ranges of the function layers are also given below in the embodiment.

By the combination of the above formulas (III), (IV), (V) and (VI), the thickness of the function layers is, for instance, as follows:

the range of the thickness $T_{E3}$ of the EML3 is: $(0.3T_1-T_C) \le T_{E3} \le (T_1-T_C)$;

the range of the thickness $T_C$ of the CBL is: $(3/13T_2-T_{E3}) \le T_C \le (0.5T_2-T_{E3})$;

the range of the thickness $T_{E2}$ of the EML2 is: $(2/13T_2-T_{E1}) \le T_{E2} \le (1/4\,T_2-T_{E3})$; and the range of the thickness $T_{E1}$ of the EML1 is: $(2/11T_3-T_{E2}) \le T_{E1} \le (1/3\,T_3-T_{E2})$.

When the OLED display panel is manufactured by utilization of a present FMM, in general, one FMMM opening corresponds to one sub-pixel region. Due to the limited FMM accuracy, the pixel density of the OLED display panel is limited.

However, in the OLED display panel provided by at least one embodiment of the present invention, the EML1, the CBL, the EML2 and the EML3 cover at least two sub-pixels. Thus, when the EMLs are prepared as above by utilization of the FMM, the minimum opening of the FMM may be as large as two sub-pixel regions, and hence the pixel density of the OLED display panel can be improved two times on the premise that the FMM accuracy is unchanged.

In addition, in the OLED display panel provided by at least one embodiment, a specific light color can be extracted independent of the optical effect, and hence the luminous efficiency of the EMLs will not suffer loss and the problem of color shift will not be caused.

In the OLED display panel provided by at least one embodiment of the present invention, the sequence of the sub-pixels is not required to be changed, and hence the image display will not be affected. Moreover, in at least one embodiment of the present invention, the thickness of the sub-pixels for displaying different colors is optimized to further ensure that the problem of color shift can be avoided at a great visual angle.

It should be noted that: in at least one embodiment of the present invention, the OLED display panel is not limited to the structure as shown in FIG. 4. For instance, the EML1 may cover the entire pixel unit, but also may cover the first sub-pixel and the second sub-pixel only; the EML3 may cover the second sub-pixel and the third sub-pixel, or may cover the entire pixel unit; the EML2 may only cover the first sub-pixel and the second sub-pixel; and the CBL may only cover the second sub-pixel and the third sub-pixel. The first sub-pixel is not limited to display blue; the second sub-pixel is not limited to display red; and the third sub-pixel is not limited to display green as long as the first sub-pixel, the second sub-pixel and the third sub-pixel display different colors and display one color among R, G and B. Of course, the color displayed by the three sub-pixels is not limited to R, G and B and, for instance, may also be white (W), yellow (Y) and the like.

Correspondingly, in the OLED display panel provided by at least one embodiment of the present invention, the optimized thickness of the sub-pixels may be correspondingly calculated by the combination of the above formulas (I) and (II) according to the specific structures of the EML1 the EML2, the EML3 and the CBL.

Second Embodiment

The pixel unit of the OLED display panel provided by the embodiment includes a first sub-pixel for displaying the first color, a second sub-pixel for displaying the second color and a third sub-pixel for displaying the third color; the pixel unit of the OLED display panel includes an anode layer, a cathode layer and an organic function layer disposed between the anode layer and the cathode layer. The organic function layer includes the following layer structures: an EML1 configured to cover at least two adjacent sub-pixels comprising the first sub-pixel and emit blue light; a CBL configured to cover the second sub-pixel and the third sub-pixel; an EML2 configured to cover the first sub-pixel and the second sub-pixel and emit red light; and an EML3 configured to cover at least two adjacent sub-pixels comprising the third sub-pixel and emit green light.

As illustrated in FIG. 5, the HOMO energy level of the EML1, the EML2, the EML3 and the CBL is all negative. The HOMO energy level of the EML1 is higher than the HOMO energy level of the EML2; the HOMO energy level of the EML2 is higher than the HOMO energy level of the EML3; and the HOMO energy level of the EML3 is higher than the HOMO energy level of the CBL. Moreover, the optical thickness $T_1$ of the first sub-pixel, the optical thickness $T_2$ of the second sub-pixel and the optical thickness $T_3$ of the third sub-pixel satisfy the following relationship:

$$T_1:T_2:T_3=(\lambda_1/n_1):(\lambda_2/n_2):(\lambda_3/n_3),$$

where $\lambda_1$, $\lambda_2$ and $\lambda_3$ respectively represent the wavelengths of light of the first color, light of the second color and light of the third light; and $n_1$, $n_2$ and $n_3$ refer to the ambient refractive index and respectively represent the reflective index of materials of function layers of sub-pixel regions under the condition of the light of the first color, the light of the second color and the light of the third color.

Figure 6:
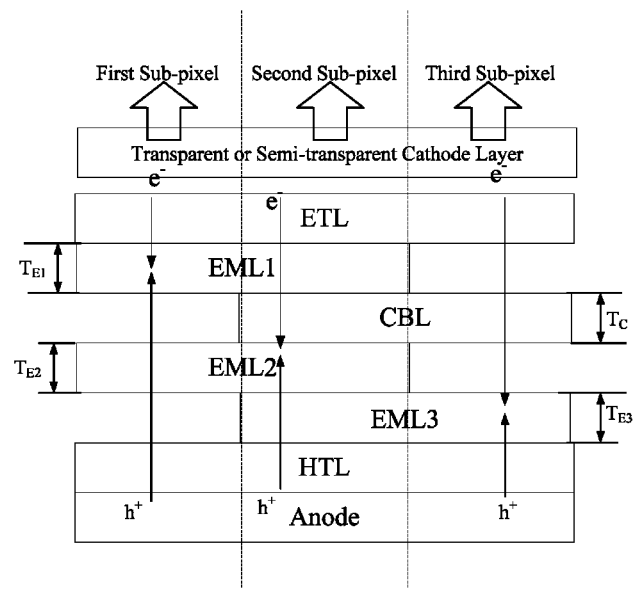
FIG. 6 is a schematic structural view of an OLED display panel provided by the second embodiment of the present invention.

For instance, in the embodiment, as illustrated in FIG. 6, the OLED display panel may comprise: an anode layer; an HTL on the anode layer; the EML3 disposed on the HTL and configured to cover the second sub-pixel and the third sub-pixel; the EML2 disposed on the EML3 and configured to cover the first sub-pixel and the second sub-pixel; the CBL disposed on the EML2 and configured to cover the second sub-pixel and the third sub-pixel; the EML1 disposed on the CBL and configured to cover the first sub-pixel and the second sub-pixel; an ETL on the EML1; and a transparent or semi-transparent cathode layer on the ETL.

The transparent cathode layer may be made from a TCO. The semi-transparent cathode layer may be made from a metal to be thin and semi-transparent.

In the OLED display panel, holes move from the anode layer to the cathode layer, can easily jump from an EML with a low HOMO energy level to an EML with a high HOMO energy level, but can be difficultly subjected to transition from an EML with a high HOMO energy level to an EML with a low HOMO energy level. When the holes are retained within a specific EML and meet with electrons, the EML will be excited to emit light.

In the OLED display panel as shown in FIG. 6, as for the first sub-pixel region, holes start from the anode layer. As the HOMO energy level of the EML2 is lower than the HOMO energy level of the EML 1, the holes can easily run through the EML2 and reach the EML 1 but cannot easily run through the ETL and will be retained within the EML1 to excite the EML1 to emit blue light, and hence the first sub-pixel displays blue light. As for the second sub-pixel region, as the HOMO energy level of the EML3 is lower than the HOMO energy level of the EML2 and the HOMO energy level of the CBL is lower than the HOMO energy level of the EML2, holes can easily run through the EML3 and reach the EML2 but cannot run through the CBL and will be retained within the EML2 to excite the EML2 to emit red light, and hence the second sub-pixel displays red light. As for the third sub-pixel region, as the HOMO energy level of the EML3 is higher than the HOMO energy level of the CBL, holes cannot run through the CBL and will be retained within the EML3 to excite the EML3 to emit green light, and hence the third sub-pixel displays green light.

In addition, in the embodiment, the OLED display panel may adopt a top-emission structure. That is to say, the top layer adopts a semi-transparent electrode to ensure that light can be emitted, and that the light color and the efficiency are as required. The optical behavior of the OLED adopting the top-emission structure can be calculated on the basis of the wave-optical standing-wave condition:

$$\varphi_1 + \varphi_2 + 2\frac{2\pi}{\lambda}nL\cos\theta = 2m\pi; \tag{I}$$

where φ refers to the phase difference caused by a reflector; n refers to the ambient refractive index, which indicates a same material will have different refractive indexes under the condition of light with different wavelengths; L refers to the cavity length (the optical thickness of the sub-pixel); $\theta$ refers to an angle; $\lambda$ refers to a wavelength; and m is an integer.

Based on the formula (I), in the embodiment, the optical thicknesses of the first sub-pixel, the second sub-pixel and the third sub-pixel for displaying different colors are optimized, and the ratio of the resonant cavity length optimized for a different light color is the ratio of XJn, namely:

$$T_1:T_2:T_3=(\lambda_1/n_1):(\lambda_2/n_2):(\lambda_3/n_3) \quad \text{(II)}.$$

In the embodiment, the first sub-pixel displays blue; the second sub-pixel displays red; and the third sub-pixel displays green. In general, the wave crest of the red light R is 600 nm to 620 nm; the wave crest of the green light G is 520 nm to 530 nm; and the wave crest of the blue light B is 450 nm to 465 nm. Generally, the refractive index of materials will have different responses to different wavelengths: the blue light is about 1 to 1.5 times of the red light, and the green light is about 1 to 1.3 times of the red light.

Thus, after the combination of the above formulas I and II, the optimized thickness design of the OLED display panel provided by the embodiment is as follows:

$$1.3 \le T_2/T_1 \le 2.0 \quad \text{(III)};$$

$$1.1 \le T_3/T_1 \le 1.5 \quad \text{(IV)}.$$

In addition, as illustrated in FIG. 6, in the OLED display panel provided by the embodiment, the relationship among the optical thickness $T_1$ of the first sub-pixel, the optical thickness $T_2$ of the second sub-pixel, the optical thickness $T_3$ of the third sub-pixel, the film thickness $T_{E1}$ of the EML1, the film thickness $T_{E2}$ of the EML2, the film thickness $T_{E3}$ of the EML3 and the film thickness $T_C$ of the CBL is also as follows:

$$T_2-T_1=T_{E3}+T_C \quad \text{(V)};$$

$$T_2-T_3=T_{E1}+T_{E2} \quad \text{(VI)}.$$

In the OLED device adopting the top-emission structure, as the top layer adopts the semi-transparent electrode, the optical effect will be strong which is referred to as microcavity effect. The influence of the film thickness on the light color is very strong. Moreover, the above optimized thickness design is adopted to ensure that the problems of color mixing and color shift can be avoided at a great visual angle.

In addition, as the thicknesses of the function layers of the conventional OLED device (particularly obvious for devices with microcavity effect) are independently adjusted according to the color requirement of each sub-pixel, in the OLED display panel adopting the top-emission structure provided by the embodiment, the thickness of each function layer is related to other function layers and other sub-pixels and influence each other, and hence it is complicated to adjust the thickness of the function layers. In view of this, the thickness range of the function layers is also given below in the embodiment.

By the combination of the above formulas (III), (IV), (V) and (VI), the thickness of the function layers is, for instance, as follows:

the range of the thickness $T_{E3}$ of the EML3 is: $(0.3T_1-T_C) \le T_{E3} \le (T_1-T_C)$;

the range of the thickness $T_C$ of the CBL is: $(3/13T_2-T_{E3}) \le T_C \le (0.5T_2-T_{E3})$;

the range of the thickness $T_{E2}$ of the EML2 is: $(2/13T_2-T_{E1}) \le T_{E2} \le (1/4\ T_2-T_{E1})$; and the range of the thickness $T_{E1}$ of the EML1 is: $(2/11T_3-T_{E2}) \le T_{E1} \le (1/3\ T_3-T_{E2})$.

In at least one embodiment of the present invention (for instance, as illustrated in FIG. 4 or 6), the cathode is transparent or semi-transparent. As described above, when the OLED display panel comprises a TCL, the optical thickness of the sub-pixel is the sum of the thickness of the organic function layer of the sub-pixel region and the thickness of the TCL (a semi-transparent layer may refer to this). In this case, the optical thickness $T_1$ of the first sub-pixel is the sum of the thickness of the organic function layer of the first sub-pixel region and the thickness of the cathode layer, namely the optical thickness $T_1$ of the first sub-pixel is the sum of the thickness of the HTL, the thickness of the EML1, the thickness of the EML2, the thickness of the ETL and the thickness of the cathode layer. The optical thickness $T_2$ of the second sub-pixel is the sum of the thickness of the HTL, the thickness of the EML1, the thickness of the CBL, the thickness of the EML2, the thickness of the EML3, the thickness of the ETL and the thickness of the cathode layer. The optical thickness $T_3$ of the third sub-pixel is the sum of the thickness of the HTL, the thickness of the CBL, the thickness of the EML3, the thickness of the ETL and the thickness of the cathode layer.

In the current technology, when the OLED display panel is manufactured by utilization of FMM, in general one FMM opening corresponds to one sub-pixel region. Due to the limited FMM accuracy, the pixel density of the OLED display panel is limited.

However, in the OLED display panel provided by at least one embodiment of the present invention, the EML1, the CBL, the EML2 and the EML3 cover at least two sub-pixels. Thus, when the EMLs are prepared by utilization of FMM, the minimum opening of the FMM may be as large as two sub-pixel regions, and hence the pixel density of the OLED display panel can be improved two times on the premise that FMM accuracy is unchanged.

In addition, in the OLED display panel provided by at least one embodiment, a specific light color is extracted not by means of the optical effect, and hence the luminous efficiency of the EMLs will not suffer loss and the problem of color shift will not be caused.

In the OLED display panel provided by at least one embodiment of the present invention, the sequence of the sub-pixels is not required to be changed, and hence the image display will not be affected. Moreover, in at least one embodiment of the present invention, the thickness of the sub-pixels for displaying different colors is optimized to further ensure that the problems of color mixing and color shift can be avoided at a great visual angle.

It should be noted that: in at least one embodiment of the present invention, the OLED display panel is not limited to the structure as shown in FIG. 6. For instance, the EML1 covers the entire pixel unit or may also cover the first sub-pixel and the second sub-pixel only; the EML3 covers the second sub-pixel and the third sub-pixel or may also cover the entire pixel unit; the EML2 only covers the first sub-pixel and the second sub-pixel; and the CBL only covers the second sub-pixel and the third sub-pixel. The first sub-pixel is not limited to display blue; the second sub-pixel is not limited to display red; and the third sub-pixel is not limited to display green as long as the first sub-pixel, the second sub-pixel and the third sub-pixel display different colors and display one color among R, G and B.

In the OLED display panel provided by at least one embodiment of the present invention, the optimized thickness of the sub-pixels may be calculated by the combination of the above formulas (I) and (II) according to the specific structures of the EML1 the EML2, the EML3 and the CBL.

The foregoing is only the preferred embodiments of the present invention and not intended to limit the scope of protection of the present invention. The scope of protection of the present invention should be defined by the appended claims.

The application claims priority to the Chinese patent application No. 201410005179.X submitted on Jan. 6, 2014. The disclosure content of the Chinese patent application is incorporated by reference herein as part of the application.

The invention claimed is:

1. An organic light-emitting diode (OLED) display panel, a pixel unit of the OLED display panel comprising a first sub-pixel for displaying a first color, a second sub-pixel for displaying a second color and a third sub-pixel for displaying a third color and further comprising an anode layer, a cathode layer and an organic function layer disposed between the anode layer and the cathode layer,
wherein the organic function layer includes:
in sequence from one side close to the anode layer to the other side close to the cathode layer, a first emission layer (EML1), a carrier blocking layer (CBL), a second emission layer (EML2), and a third emission layer (EML3), wherein energy levels of lowest unoccupied molecular orbitals (LUMO) of a matrix substance of the CBL, a matrix substance of the EML3, a matrix substance of the EML2 and a matrix substance of the EML1 are sequentially reduced;
the first emission layer (EML1) covers at least two adjacent sub-pixels comprising the first sub-pixel;
the carrier blocking layer (CBL) covers the second sub-pixel and the third sub-pixel;
the second emission layer (EML2) is arranged at an area provided with the first sub-pixel and the second sub-pixel and at least covers the second sub-pixel; and
the third emission layer (EML3) covers at least two adjacent sub-pixels comprising the third sub-pixel;
the organic function layer further includes:
a hole transport layer (HTL) disposed between the anode layer and the EML1; and
an electron transport layer (ETL) disposed between the EML3 and the cathode layer; and
the cathode layer is transparent or semi-transparent.

2. The OLED display panel according to claim 1, comprising:
the EML1 configured to cover the entire pixel unit;
the CBL configured to cover the second sub-pixel and the third sub-pixel;
the EML2 configured to cover the first sub-pixel and the second sub-pixel; and
the EML3 configured to cover the entire pixel unit.

3. The OLED display panel according to claim 1, comprising:
the EML1 configured to cover the entire pixel unit;
the CBL configured to cover the second sub-pixel and the third sub-pixel;
the EML2 configured to cover the first sub-pixel and the second sub-pixel; and
the EML3 configured to cover the second sub-pixel and the third sub-pixel.

4. The OLED display panel according to claim 1, comprising:
the EML1 configured to cover the first sub-pixel and the second sub-pixel;
the CBL configured to cover the second sub-pixel and the third sub-pixel;
the EML2 configured to cover the first sub-pixel and the second sub-pixel; and
the EML3 configured to cover the entire pixel unit.

5. The OLED display panel according to claim 1, comprising:
the EML1 configured to cover the first sub-pixel and the second sub-pixel;
the CBL configured to cover the second sub-pixel and the third sub-pixel;
the EML2 configured to cover the first sub-pixel and the second sub-pixel; and
the EML3 configured to cover the second sub-pixel and the third sub-pixel.

6. The OLED display panel according to claim 1, wherein an optical thickness $T_1$ of the first sub-pixel, an optical thickness $T_2$ of the second sub-pixel and an optical thickness $T_3$ of the third sub-pixel satisfy following relationship:

$$T_1:T_2:T_3=:(\lambda_2/n_2):(\lambda_3/n_3),$$

where $\lambda_1$, $\lambda_2$ and $\lambda_3$ respectively represent wavelengths of light of the first color, light of the second color and light of the third color; and $n_1$, $n_2$ and $n_3$ respectively represent reflective indexes of materials of function layers of sub-pixel regions under the condition of the light of the first color, the light of the second color and the light of the third color;
wherein where the OLED display panel does not comprise a transparent conductive layer (TCL), an optical thickness of the sub-pixel is a thickness of the organic function layer of the sub-pixel region; or
where the OLED display panel comprises a TCL, the optical thickness of the sub-pixel is a sum of the thickness of the organic function layer of the sub-pixel region and a thickness of the TCL.

7. The OLED display panel according to claim 1, wherein an optical thickness $T_1$ of the first sub-pixel, an optical thickness $T_2$ of the second sub-pixel and an optical thickness $T_3$ of the third sub-pixel satisfy following relationship:

$$1.3 \le T_2/T_1 \le 2.0;$$

$$1.1 \le T_3/T_1 \le 1.5;$$

wherein where the OLED display panel does not comprise a TCL, an optical thickness of the sub-pixel is an thickness of the organic function layer of the sub-pixel region; or
where the OLED display panel comprises a TCL, the optical thickness of the sub-pixel is a sum of the thickness of the organic function layer of the sub-pixel region and a thickness of the TCL.

8. The OLED display panel according to claim 1, wherein
the range of the thickness $T_{E3}$ of the EML3 is: $(0.3T_1-T_C) \le T_{E3} \le (T_1-T_C)$;
the range of the thickness $T_C$ of the CBL is: $(3/13T_2-T_{E3}) \le T_C \le (0.5T_2-T_{E3})$;
the range of the thickness $T_{E2}$ of the EML2 is: $(2/13T_2-T_{E1}) \le T_{E2} \le (1/4T_2-T_{E1})$;
the range of the thickness $T_{E1}$ of the EML1 is: $(2/11T_3-T_{E2}) \le T_{E1} \le (1/3T_3-T_{E2})$;
where $T_1$, $T_2$ and $T_3$ respectively represent an optical thickness of the first sub-pixel, an optical thickness of the second sub-pixel and an optical thickness of the third sub-pixel;
where the OLED display panel does not comprise a TCL, an optical thickness of the sub-pixel is a thickness of the organic function layer of the sub-pixel region; or where the OLED display panel comprises a TCL, the optical thickness of the sub-pixel is a sum of the thickness of the organic function layer of the sub-pixel region and a thickness of the TCL.

9. A display device, comprising the OLED display panel according to claim 1.

10. An organic light-emitting diode (OLED) display panel, a pixel unit of the OLED display panel comprising a first sub-pixel for displaying a first color, a second sub-pixel for displaying a second color and a third sub-pixel for displaying a third color and further comprising an anode layer, a cathode layer and an organic function layer disposed between the anode layer and the cathode layer, wherein the organic function layer includes:

in sequence from one side close to the cathode layer to the other side close to the anode layer a first emission layer (EML1), a carrier blocking layer (CBL), a second emission layer (EML2) and a third emission layer (EML3), wherein energy levels of highest occupied molecular orbitals (HOMO) of a matrix substance of the EML1, a matrix substance of the EML2, a matrix substance of the EML3 and a matrix substance of the CBL are sequentially reduced;

the first emission layer (EML1) covers at least two adjacent sub-pixels comprising the first sub-pixel;

the carrier blocking layer (CBL) covers the second sub-pixel and the third sub-pixel;

the second emission layer (EML2) is arranged at an area provided with the first sub-pixel and the second sub-pixel and at least covers the second sub-pixel; and the third emission layer (EML3) covers at least two adjacent sub-pixels comprising the third sub-pixel;

the organic function layer further includes:

an HTL disposed between the anode layer and the EML3; and an ETL disposed between the EML1 and the cathode layer; and the cathode layer is transparent or semi-transparent.

11. The OLED display panel according to claim 10, comprising:

the EML1 configured to cover the entire pixel unit;
the CBL configured to cover the second sub-pixel and the third sub-pixel;
the EML2 configured to cover the first sub-pixel and the second sub-pixel; and
the EML3 configured to cover the entire pixel unit.

12. The OLED display panel according to claim 10, comprising:

the EML1 configured to cover the entire pixel unit;
the CBL configured to cover the second sub-pixel and the third sub-pixel;
the EML2 configured to cover the first sub-pixel and the second sub-pixel; and
the EML3 configured to cover the second sub-pixel and the third sub-pixel.

13. The OLED display panel according to claim 10, comprising:

the EML1 configured to cover the first sub-pixel and the second sub-pixel;
the CBL configured to cover the second sub-pixel and the third sub-pixel;
the EML2 configured to cover the first sub-pixel and the second sub-pixel; and
the EML3 configured to cover the entire pixel unit.

14. The OLED display panel according to claim 10, comprising:

the EML1 configured to cover the first sub-pixel and the second sub-pixel;
the CBL configured to cover the second sub-pixel and the third sub-pixel;
the EML2 configured to cover the first sub-pixel and the second sub-pixel; and
the EML3 configured to cover the second sub-pixel and the third sub-pixel.

* * * * *